United States Patent
Tsai et al.

(10) Patent No.: US 8,039,844 B2
(45) Date of Patent: Oct. 18, 2011

(54) MICROCRYSTALLINE SILICON THIN FILM TRANSISTOR AND METHOD FOR MANUFACTURING THE SAME

(75) Inventors: Cheng-Ju Tsai, Taipei (TW); Bo-Chu Chen, Hsinchu (TW); Ding-Kang Shih, Kaohsiung (TW); Jung-Jie Huang, Yunlin (TW); Yung-Hui Yeh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 392 days.

(21) Appl. No.: 12/190,015

(22) Filed: Aug. 12, 2008

(65) Prior Publication Data
US 2009/0184321 A1 Jul. 23, 2009

(30) Foreign Application Priority Data
Jan. 23, 2008 (TW) ................................ 97102563 A

(51) Int. Cl.
 *H01L 29/10* (2006.01)
 *H01L 31/112* (2006.01)
(52) U.S. Cl. ................ 257/66; 257/61; 257/64; 257/72; 257/E29.117; 257/E29.277; 257/29.291
(58) Field of Classification Search .................... 257/66, 257/61, 64, 72, E29.117, E29.277, E29.291
See application file for complete search history.

(56) References Cited

U.S. PATENT DOCUMENTS

| | | | | |
|---|---|---|---|---|
| 5,473,168 | A  * | 12/1995 | Kawai et al. | 257/61 |
| 6,677,191 | B1 * | 1/2004 | Battersby | 438/161 |
| 6,680,486 | B1 * | 1/2004 | Yamazaki | 257/66 |
| 6,759,711 | B2 * | 7/2004 | Powell | 257/347 |
| 2005/0258427 | A1 * | 11/2005 | Chan et al. | 257/72 |

OTHER PUBLICATIONS

Kunal S. Girotra, JunHyung Souk, Kyuha Chung, Soonkwon Um, Shiyul Kim, Byoung-Jun. Kim, Sung-Hoon Yang, Beohmrock Choi, Joonchul Goh, Young-Rok Song, Yong-Mo Choi; "70.4 A 14.1 inch AMOLED Display using Highly Stable PECVD based Microcrystalline Silicon TFT Backplane", 70.4/ K.S. Girotra p. 1972-1975.

* cited by examiner

*Primary Examiner* — Long Tran
(74) *Attorney, Agent, or Firm* — Birch, Stewart, Kolasch & Birch, LLP

(57) ABSTRACT

This invention provides a top-gate microcrystalline thin film transistor and a method for manufacturing the same. An inversion layer channel is formed in a top interface of a microcrystalline active layer, and being separated from an incubation layer in a bottom interface of the microcrystalline active layer. The inversion layer channel is formed in the crystallized layer of the top interface of the microcrystalline active layer. As such, the present microcrystalline thin film transistor has better electrical performance and reliability.

8 Claims, 3 Drawing Sheets

MICROCRYSTALLINE SILICON THIN FILM TRANSISTOR AND METHOD FOR MANUFACTURING THE SAME

BACKGROUND OF THE INVENTION

1. Field of the Invention

The present invention relates to a microcrystalline silicon thin film transistor and a method for manufacturing the same. More particularly, the present invention relates to a top gate microcrystalline silicon thin film transistor and a method for manufacturing the same.

2. Description of the Related Art

The low temperature polysilicon thin film transistors (LTPS-TFTs) compared to the conventional amorphous silicon thin film transistor has higher electron mobility and better reliability. At present, the polysilicon thin film manufacturing process is performed mostly by solid phase crystallization or costly excimer laser annealing method. The solid phase crystallization needs higher crystallization temperature and thus requires a silicon wafer or a quarts wafer as a substrate. The cost is expensive and inappropriate to large-area production. The excimer laser annealing method can lower the crystallization temperature, but requiring expensive equipments. The throughput is also not high. As to the microcrystalline silicon thin film transistor manufactured by the plasma enhanced chemical vapor deposition system conventionally continues the structure of the bottom gate type device. Please refer to FIG. 1, generally during the growth of the microcrystalline silicon layer (μc-Si layer) 103, an amorphous incubation layer 102 is formed between an insulating layer 101 and the microcrystalline silicon thin film 103, resulting in an inversion channel region of a microcrystalline silicon thin film transistor subsequently completed is formed in the amorphous incubation layer 102 and can not be formed in a crystallized thin film. The microcrystalline silicon thin film transistor device would not have good electrical performance.

FIG. 2 is a schematic cross-sectional view of a conventional bottom gate microcrystalline silicon thin film transistor, including a substrate 200, a pair of microcrystalline silicon layer containing n$^+$ dopants 204a and 204b, and a pair of source/drain metal electrodes 205a and 205b. The bottom gate electrode 201 is positioned on the substrate 200, and the insulating layer 202 is positioned on the bottom gate electrode 201. The microcrystalline silicon layer 203 is positioned on the insulating layer 202, and the microcrystalline silicon layers containing n$^+$ dopants 204a and 204b are respectively positioned on the microcrystalline silicon layer 203 at two opposite sides of the bottom gate electrode 201. The pair of the source/drain metal electrodes 205a and 205b is respectively positioned on one of the pair of the microcrystalline silicon layers containing n$^+$ dopants 204a and 204b. The pair of the source/drain metal electrodes 205a and 205b respectively forms ohmic contact with an overlying electrical contact (not shown). An inversion channel region of the bottom gate microcrystalline silicon thin film transistor is formed in an interface between the insulating layer 202 and the bottom portion of the microcrystalline silicon layer 203. The conventional bottom gate microcrystalline silicon thin film transistor can directly employ the plasma enhanced chemical vapor deposition method to sequentially grow the insulating layer 202, the microcrystalline silicon layer 203 and the pair of the microcrystalline silicon layer containing n$^+$ dopants 204a and 204b. During the sequential growth of various thin films, an amorphous incubation layer is formed in an interface between the insulating layer 202 and the microcrystalline silicon layer 203, as shown in FIG. 1, and resulting in the inversion channel region of the bottom gate microcrystalline silicon thin film transistor can not be formed in a crystallized layer. The electrical performance of the bottom gate microcrystalline silicon thin film transistor would not be good.

SUMMARY OF THE INVENTION

The present invention provides a microcrystalline silicon thin film transistor, which is a kind of design of top gate microcrystalline silicon thin film transistor with its inversion channel formed in a microcrystalline thin film of an upper interface of its microcrystalline silicon active layer, and separating from an amorphous incubation layer in a lower interface of the microcrystalline silicon active layer, hence improving electron mobility and electric reliability of the microcrystalline silicon thin film transistor of this invention.

In one aspect, the present invention provides a microcrystalline silicon thin film transistor comprising a substrate, a pair of source/drain electrodes, a microcrystalline silicon layer containing dopants of first conductivity, a microcrystalline silicon layer, an insulating layer and a top gate electrode. The pair of the source/drain electrodes is positioned on the substrate, and the microcrystalline silicon layer containing dopants of first conductivity is respectively positioned on each of the source/drain electrodes. The microcrystalline silicon layer is positioned on the microcrystalline silicon layer containing dopants of first conductivity, and the insulating layer is positioned on the microcrystalline silicon layer. The top gate electrode is positioned on the insulating layer between the pair of the source/drain electrodes. An interface of the microcrystalline silicon layer and the insulating layer between the pair of the source/drain electrodes comprises a channel region.

In one another aspect, the present invention provides a microcrystalline silicon thin film transistor comprises a substrate, a microcrystalline silicon layer, a pair of microcrystalline silicon layer containing dopants of first conductivity, a pair of source/drain electrodes, an insulating layer and a top gate electrode. The microcrystalline silicon layer is positioned on the substrate, and the pair of the microcrystalline silicon layer containing dopants of first conductivity is positioned on the microcrystalline silicon layer. The pair of the source/drain electrodes is respectively positioned on one of the microcrystalline silicon layer containing dopants of first conductivity. The insulating layer is positioned on the pair of the source/drain electrodes. The top gate electrode is positioned on the insulating layer between the pair of the source and drain electrodes. An interface of the microcrystalline silicon layer and the insulating layer between the pair of the microcrystalline silicon layer containing dopants of first conductivity comprise a channel region.

The channel region of the present microcrystalline silicon thin film transistor is formed in the interface of the microcrystalline silicon layer and the insulating layer overlying to separate from an amorphous incubation layer in a lower interface of the microcrystalline silicon layer. The channel region has a crystallized structure and can improve the electrical performance of the present microcrystalline silicon thin film transistor.

In still another aspect, the present invention provides a double-gate microcrystalline silicon thin film transistor, comprising a substrate, a buffer layer, a microcrystalline silicon layer, a pair of microcrystalline silicon layers containing dopants of first conductivity, a pair of source/drain electrodes, an insulating layer, a top gate electrode and a bottom gate electrode. The buffer layer is positioned on the substrate, and the microcrystalline silicon layer is positioned on the buffer layer. The pair of the microcrystalline silicon layers containing dopants of first conductivity is positioned on the microcrystalline silicon layer. The pair of the source/drain electrodes is respectively positioned on one of the microcrystalline silicon layer containing dopants of first conductivity. The insulating layer is positioned on the pair of the source/drain electrodes. The top gate electrode is positioned on the insulating layer between the pair of the source/drain electrodes. The bottom gate electrode is positioned between the substrate and the buffer layer corresponding to the top gate electrode. The interface of the microcrystalline silicon layer and the insulating layer between the pair of the microcrystalline silicon layers containing dopants of first conductivity comprises a channel region.

In the above microcrystalline silicon thin film transistor, the bottom gate electrode can enhance a contact area between the channel region and the pair of the microcrystalline silicon layer containing dopants of first conductivity to decrease serial resistance in the present microcrystalline silicon thin film transistor.

The present invention provides a method for manufacturing a microcrystalline silicon thin film transistor, comprising providing a substrate, forming a pair of source/drain electrodes on the substrate, forming a pair of microcrystalline silicon layer containing dopants of first conductivity respectively on one of the source/drain electrodes, forming a microcrystalline silicon layer on the pair of microcrystalline silicon layer containing dopants of first conductivity, forming an insulating layer on the microcrystalline silicon layer, and forming a top gate electrode on the insulating layer between the pair of the source and drain electrodes to form a channel region in an interface of the microcrystalline silicon layer and the insulating layer between the pair of the source/drain electrodes.

The present invention provides another method for manufacturing a microcrystalline silicon thin film transistor, comprising providing a substrate, forming a microcrystalline silicon layer on the substrate, forming a pair of microcrystalline silicon layer containing dopants of first conductivity on the microcrystalline silicon layer, forming a pair of source/drain electrodes respectively on one of the microcrystalline silicon layer containing dopants of first conductivity, forming an insulating layer on the pair of the source/drain electrodes, and forming a top gate electrode on the insulating layer between the pair of the source/drain electrodes to form a microcrystalline silicon channel region in an interface of the microcrystalline silicon layer and the insulating layer between the pair of the source/drain electrodes.

DETAILED DESCRIPTION OF THE PREFERRED EMBODIMENTS

This invention employs different designs of top gate microcrystalline silicon thin film transistors to improve the electrical characteristics and reliability of the top gate microcrystalline silicon thin film transistors. The structures of the top gate microcrystalline silicon thin film transistors of the present invention and their manufacturing methods will be described in detail according to following preferred embodiments along with accompanying drawings.

Figure 1:
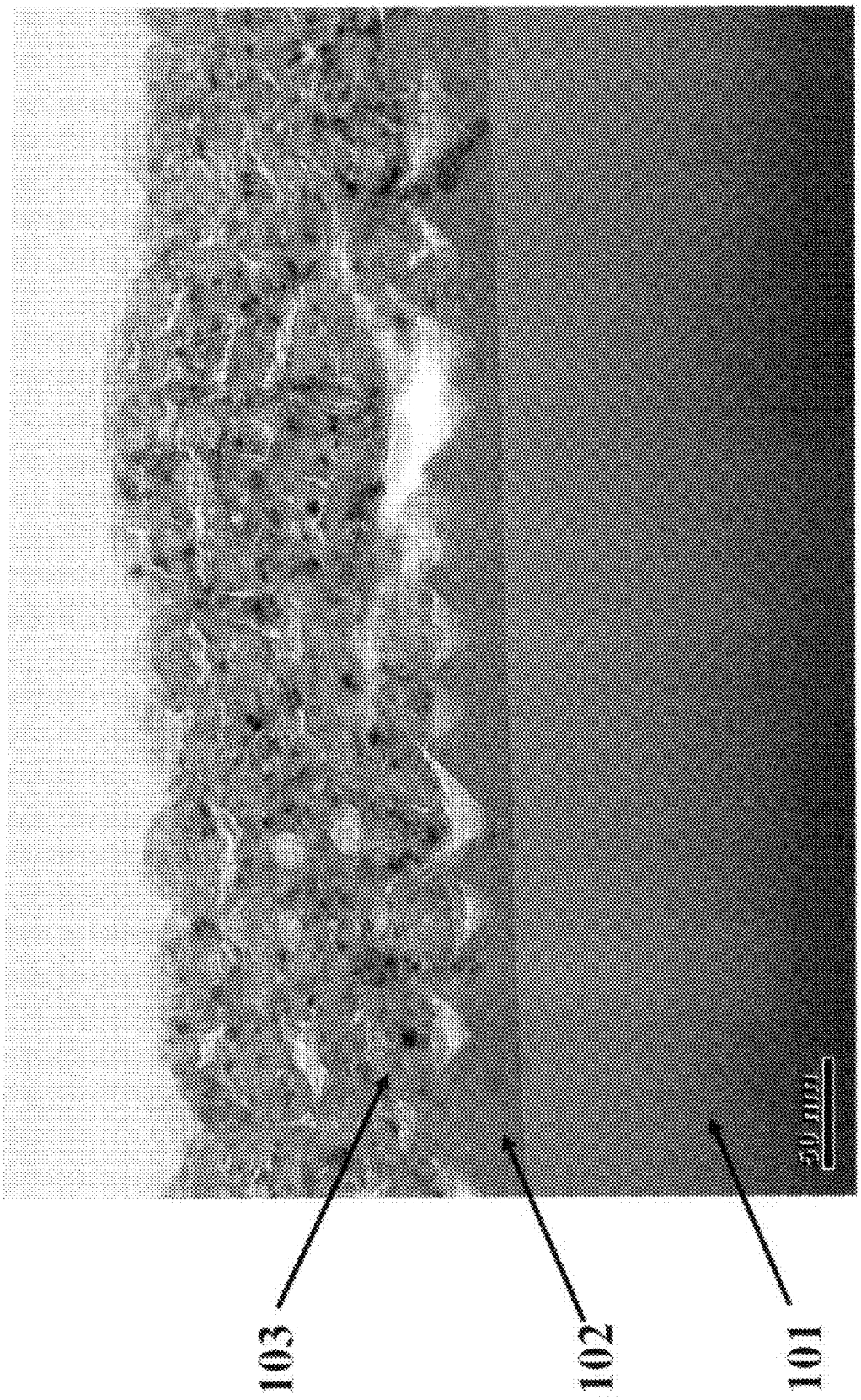
FIG. 1 shows when a microcrystalline silicon layer is grown on an insulating layer, an amorphous incubation layer will be formed between the microcrystalline silicon layer and the insulating layer.
Figure 2:
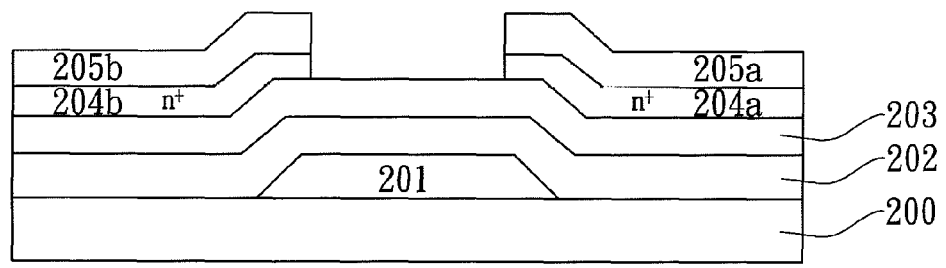
FIG. 2 is a schematic cross-sectional view of a conventional bottom gate microcrystalline silicon thin film transistor.
Figure 3:
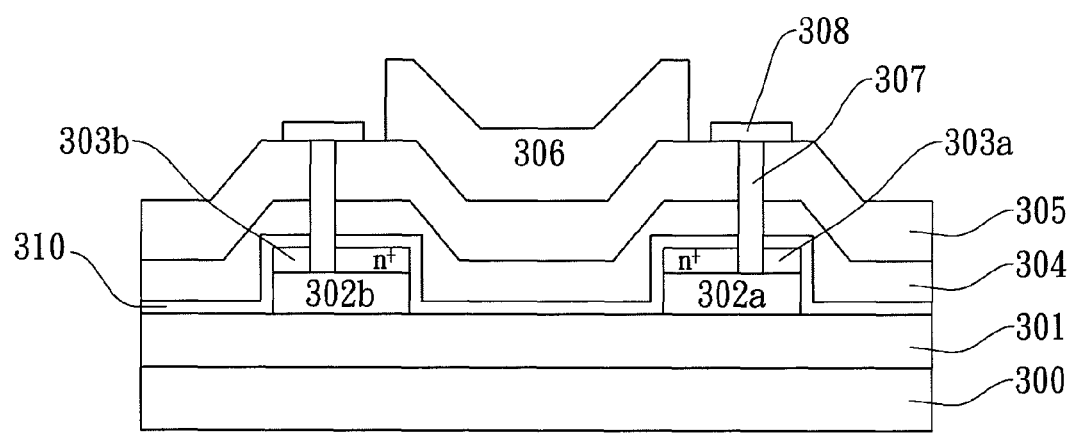
FIG. 3 is a schematic cross-sectional view of a microcrystalline silicon thin film transistor according to a first preferred embodiment of the present invention.

FIG. 3 is a schematic cross-sectional view of the microcrystalline silicon thin film transistor according to a first preferred embodiment of the present invention. In the first preferred embodiment, a buffer layer 301 is firstly formed on a substrate 300, for example a metal substrate, a glass substrate or a plastic substrate. The buffer layer 301 can be a silicon nitride ($SiN_x$) layer, a silicon oxide ($SiO_x$) layer or a silicon oxynitride ($SiN_xO_y$) layer. Subsequently, a pair of source/drain metal electrodes 302a and 302b is formed on the buffer layer 301. A pair of microcrystalline silicon layers containing $n^+$ dopants 303a and 303b are respectively formed on one of the pair of the source/drain metal electrodes 302a and 302b. The pair of the microcrystalline silicon layers containing $n^+$ dopants 303a and 303b can be formed by adding $PH_3$ gas during the deposition of the microcrystalline silicon layer to obtain a microcrystalline silicon layer containing $n^+$ dopants, and patterning it to form the pair of the microcrystalline silicon layers containing $n^+$ dopants 303a and 303b. Alternatively, the pair of the microcrystalline silicon layers containing $n^+$ dopants 303a and 303b can be replaced by a pair of microcrystalline silicon layers containing $p^+$ dopants. For example, adding $B_2H_6$ gas during the deposition of the microcrystalline silicon layer to obtain a microcrystalline silicon layer containing $p^+$ dopants, and patterning it to form the pair of the microcrystalline silicon layer containing $p^+$ dopants. Next, a microcrystalline silicon layer (μc-Si layer) 304 is formed on the pair of the microcrystalline silicon layers containing $n^+$ dopants 303a and 303b. An insulating layer 305, for example a silicon nitride ($SiN_x$) layer, a silicon oxide ($SiO_x$) layer or a silicon oxynitride ($SiN_xO_y$) layer is formed on the microcrystalline silicon layer 304. A top gate electrode 306 is formed on the insulating layer 305 corresponding to a region between the pair of the source/drain metal electrodes 302a and 302b. The top gate electrode 306 can be a metal gate. A pair of electrical contacts 307 respectively passes through the insulating layer 305, the microcrystalline silicon layer 304 and the microcrystalline silicon layer containing $n^+$ dopants 303a and 303b, and forming ohmic contact with one of the source/drain metal electrodes 302a and 302b. A conductive pad 308 is formed on each of the electrical contacts 307 to establish electrical communication with the external. A region of the insulating layer 305 corresponding to the bottom of the top gate electrode 306 is served as a gate insulating layer of the microcrystalline silicon thin film transistor. An inversion channel region of the microcrystalline silicon thin film transistor is formed in an interface of the top portion of the microcrystalline silicon layer 304 and the insulating layer 305 between the source/drain metal electrodes 302a and 302b. As such, the design of the top gate microcrystalline silicon thin film transistor makes the inversion channel region formed in the crystallized thin film, separating from the amorphous incubation layer 310 of the interface between the bottom of the microcrystalline silicon layer 304 and the buffer layer 301. As a consequence, the channel region of the top gate microcrystalline silicon thin film transistor of the present invention would own better electron mobility. The electrical characteristics and reliability of the top gate microcrystalline silicon thin film transistor are improved.

Figure 4:
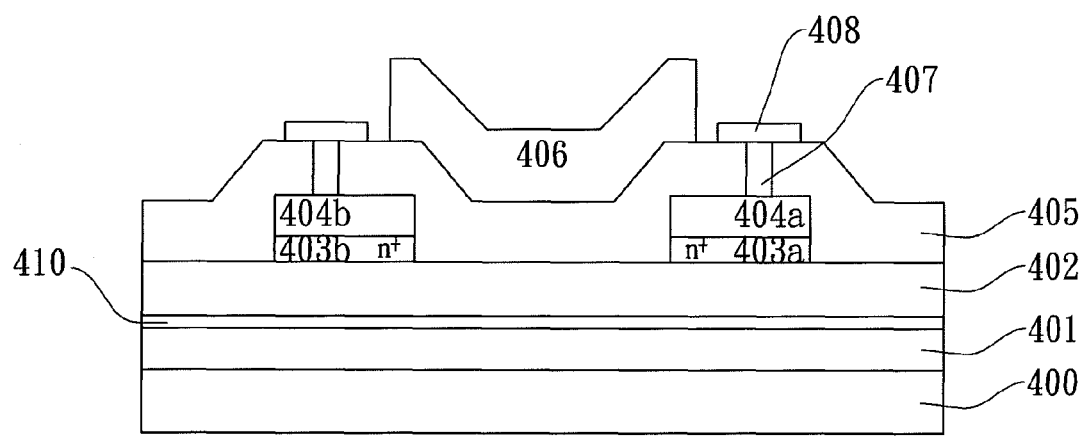
FIG. 4 is a schematic cross-sectional view of a microcrystalline silicon thin film transistor according to a second preferred embodiment of the present invention.

FIG. 4 is a schematic cross-sectional view of the microcrystalline silicon thin film transistor according to a second preferred embodiment of the present invention. In the second preferred embodiment, a buffer layer 401 is firstly formed on a substrate 400, for example a metal substrate, a plastic substrate or a glass substrate. The buffer layer 401 can be a silicon nitride ($SiN_x$) layer, a silicon oxide ($SiO_x$) layer or a silicon oxynitride ($SiN_xO_y$) layer. Subsequently, a microcrystalline silicon layer 402 is formed on the buffer layer 401. A pair of the microcrystalline silicon layer containing $n^+$ dopants 403a and 403b is formed on the microcrystalline silicon layer 402. The microcrystalline silicon layers containing $n^+$ dopants 403a and 403b can be formed by adding $PH_3$ gas during the deposition of the microcrystalline silicon layer to obtain a microcrystalline silicon layer containing $n^+$ dopants, and patterning it to form the microcrystalline silicon layers containing $n^+$ dopants 403a and 403b. Alternatively, the microcrystalline silicon layers containing $n^+$ dopants 403a and 403b can be replaced by microcrystalline silicon layers containing $p^+$ dopants. For example, $B_2H_6$ gas can be added during the deposition of the microcrystalline silicon layer to obtain a microcrystalline silicon layer containing $p^+$ dopants, and patterning it to obtain the microcrystalline silicon layers containing $p^+$ dopants. Subsequently, a pair of source/drain metal electrodes 404a and 404b is respectively formed on one of the microcrystalline silicon layers containing $n^+$ dopants 403a and 403b. An insulating layer 405, for example a silicon nitride ($SiN_x$) layer, a silicon oxide ($SiO_x$) layer or a silicon oxynitride ($SiN_xO_y$) layer, is formed on the pair of the source/drain metal electrodes 404a and 404b. Then, a top gate electrode 406 is formed on the insulating layer 405 corresponding to the region between the pair of the source/drain metal electrodes 404a and 404b. The top gate electrode 406 can be a metal electrode. A pair of electrical contacts 407 respectively passes through the insulating layer 405 to form ohmic contact with the respective source/drain metal electrodes 404a and 404b. A conductive pad 408 is formed on each of the electrical contacts 407 to establish electrical communication with the external. A region of the insulating layer 405 corresponding to the bottom of the top gate electrode 406 is served as the gate insulating layer of the microcrystalline silicon thin film transistor. An inversion channel region of the microcrystalline silicon thin film transistor is formed in an interface of the top portion of the microcrystalline silicon layer 402 and the insulating layer 405 between the source/drain metal electrodes 404a and 404b. As such, the design of the top gate microcrystalline silicon thin film transistor of the second preferred embodiment makes the inversion channel region formed in the crystallized thin film, separating from the amorphous incubation layer 410 of the interface between the bottom of the microcrystalline silicon layer 402 and the buffer layer 401.

Figure 5:
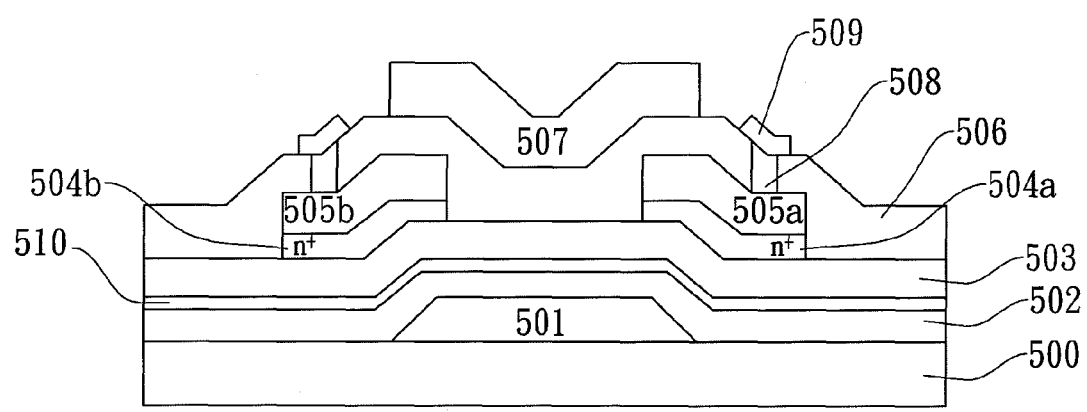
FIG. 5 is a schematic cross-sectional view of a microcrystalline silicon thin film transistor according to a third preferred embodiment of the present invention.

FIG. 5 is a schematic cross-sectional view of the microcrystalline silicon thin film transistor according to a third preferred embodiment of the present invention, which is a design of double-gate microcrystalline silicon thin film transistor. In the third preferred embodiment, a bottom gate electrode 501 is firstly formed on a substrate 500, for example a metal substrate, a plastic substrate or a glass substrate. The bottom gate electrode 501 can be a metal electrode. Subsequently, a buffer layer 502 is formed on the bottom gate electrode 501.

The buffer layer 502 can be a silicon nitride ($SiN_x$) layer, a silicon oxide ($SiO_x$) layer or a silicon oxynitride ($SiN_xO_y$) layer. A microcrystalline silicon layer 503 is formed on the buffer layer 502. Then, a pair of the microcrystalline silicon layers containing $n^+$ dopants 504a and 504b is formed on the microcrystalline silicon layer 503 and respectively corresponding to two opposite sides of the bottom gate electrode 501. The pair of the microcrystalline silicon layers containing $n^+$ dopants 504a and 504b can be formed by adding $PH_3$ gas during the deposition of the microcrystalline silicon layer to obtain a microcrystalline silicon layer containing $n^+$ dopants, and patterning it to form the microcrystalline silicon layer containing $n^+$ dopants 504a and 504b. Alternatively, the microcrystalline silicon layers containing $n^+$ dopants 504a and 504b can be replaced by a pair of microcrystalline silicon layers containing $p^+$ dopants. For example, adding $B_2H_6$ gas during the deposition of the microcrystalline silicon layer containing $p^+$ dopants, and patterning it to form the pair of the microcrystalline silicon layers containing $p^+$ dopants. Thereafter, a pair of source/drain metal electrodes 505a and 505b is respectively formed on one of the microcrystalline silicon layers containing $n^+$ dopants 504a and 504b. An insulating layer 506, for example a silicon nitride ($SiN_x$) layer, a silicon oxide ($SiO_x$) layer or a silicon oxynitride ($SiN_xO_y$) layer, is formed on the pair of the source/drain metal electrodes 505a and 505b. Then, a top gate electrode 507 is formed on the insulating layer 506 corresponding to the bottom gate electrode 501. The top gate electrode 507 can be a metal electrode. A pair of electrical contacts 508 is formed and passes through the insulating layer 506 to form ohmic contact respectively with one of the pair of the source/drain metal electrodes 505a and 505b. A conductive pad 509 is formed on each of the electrical contacts 508 to establish electrical communication with the external. A region of the insulating layer 506 between the pair of the source/drain metal electrodes 505a and 505b is served as a gate insulating layer of the double-gate microcrystalline silicon thin film transistor. An inversion channel region is formed in an interface of the top portion of the microcrystalline silicon layer 503 and the insulating layer 506 between the pair of the source/drain metal electrodes 505a and 505b. The inversion channel region is separated from an amorphous incubation layer 510 present in an interface between the bottom of the microcrystalline silicon layer 503 and the buffer layer 502.

When a voltage is applied unto the top gate electrode 507, a part of the electrical field generated by the top gate electrode 507 is shielded by the parts of the pair of the source/drain metal electrodes 505a and 505b overlapped with the top gate electrode 507. In the third preferred embodiment, an auxiliary bottom gate electrode 501 is added to enhance a contact area between the inversion channel region and the pair of the microcrystalline silicon layers containing $n^+$ dopants 504a and 504b to reduce serial resistance in the microcrystalline silicon thin film transistor of the present invention. The electrical characteristics of the present microcrystalline silicon thin film transistor are improved.

The insulating layer, microcrystalline silicon layer and the microcrystalline silicon layer containing electrical conductive dopants, for example the microcrystalline silicon layer containing $n^+$ dopants or $p^+$ dopants, can be formed sequentially by plasma enhanced chemical vapor deposition methods. The method for manufacturing the microcrystalline silicon thin film transistor of the present invention does not need ion implantation and activation processes generally used for manufacturing the conventional low temperature polysilicon thin film transistor. The present invention employs the plasma enhanced chemical vapor deposition method to sequentially grow the insulating layer, the microcrystalline silicon layer and the microcrystalline silicon layer containing electrical conductive dopants, which facilitates the manufacturing of the thin film transistor devices in a large-area scale and also provides the manufacturing uniformity of good devices in the large area. The present microcrystalline silicon thin film transistors and their methods are applicable in the manufacture of organic light emitting diode panels.

While the invention has been described by way of examples and in terms of preferred embodiments, it is to be understood that various changes, substitutions, and alterations can be made herein without departing from the spirit and scope of the invention as defined by the appended claims.

What is claimed is:

1. A microcrystalline silicon thin film transistor, comprising:
   a substrate;
   a pair of source/drain electrodes positioned on said substrate;
   a microcrystalline silicon layer containing dopants with first conductivity, respectively positioned on each of the pair of said source/drain electrodes;
   a microcrystalline silicon layer positioned on said microcrystalline silicon layer containing dopants with first conductivity;
   an amorphous incubation layer formed between said substrate and said microcrystalline silicon layer;
   an insulating layer positioned on said microcrystalline silicon layer; and
   a top gate electrode positioned on said insulating layer between the pair of said source/drain electrodes;
   wherein an interface of said microcrystalline silicon layer and said insulating layer between the pair of said source/drain electrodes comprises a channel region.

2. The microcrystalline silicon thin film transistor of claim 1, further comprising a buffer layer positioned between said substrate and the pair of said source/drain electrodes.

3. The microcrystalline silicon thin film transistor of claim 1, wherein said substrate comprises a metal substrate, a glass substrate or a plastic substrate.

4. The microcrystalline silicon thin film transistor of claim 1, wherein said microcrystalline silicon layer containing dopants with first conductivity comprises a microcrystalline silicon layer with $n^+$ dopants or $p^+$ dopants.

5. The microcrystalline silicon thin film transistor of claim 1, wherein said insulating layer comprises silicon nitride ($SiN_x$), silicon oxide ($SiO_x$) or silicon oxynitride ($SiN_xO_y$).

6. The microcrystalline silicon thin film transistor of claim 1, wherein the pair of said source/drain electrodes are metal electrodes.

7. The microcrystalline silicon thin film transistor of claim 1, wherein said top gate electrode is a metal electrode.

8. The microcrystalline silicon thin film transistor of claim 2, wherein said buffer layer comprises silicon nitride ($SiN_x$), silicon oxide ($SiO_x$) or silicon oxynitride ($SiN_xO_y$).

* * * * *